(12) United States Patent
Chang

(10) Patent No.: US 8,669,894 B2
(45) Date of Patent: Mar. 11, 2014

(54) ANALOG-TO-DIGITAL CONVERTING METHOD AND FUNCTIONAL DEVICE USING THE SAME

(75) Inventor: Ming-Hung Chang, Hsinchu County (TW)

(73) Assignee: Anpec Electronics Corporation, Hsinchu Science Park, Hsin-Chu (TW)

(*) Notice: Subject to any disclaimer, the term of this patent is extended or adjusted under 35 U.S.C. 154(b) by 524 days.

(21) Appl. No.: 13/026,311

(22) Filed: Feb. 14, 2011

(65) Prior Publication Data

US 2012/0121109 A1    May 17, 2012

(30) Foreign Application Priority Data

Nov. 15, 2010   (TW) ............................... 99139164 A

(51) Int. Cl.
*H03M 1/12*    (2006.01)
(52) U.S. Cl.
USPC .......................................................... 341/156
(58) Field of Classification Search
USPC ................. 341/140–160; 381/100, 120, 276; 708/250; 713/500; 375/146, 147, 141, 375/E1.001
See application file for complete search history.

(56) References Cited

U.S. PATENT DOCUMENTS

| | | | | |
|---|---|---|---|---|
| 6,252,535 B1* | 6/2001 | Kober et al. | .................. | 341/155 |
| 6,701,297 B2* | 3/2004 | Main | .............................. | 704/500 |
| 6,771,198 B2* | 8/2004 | Azadet | .......................... | 341/110 |
| 7,193,544 B1* | 3/2007 | Fitelson et al. | ............... | 341/143 |
| 7,280,259 B2* | 10/2007 | Sanger | ......................... | 358/504 |
| 7,324,036 B2* | 1/2008 | Petre et al. | ..................... | 341/155 |
| 7,430,257 B1* | 9/2008 | Shattil | ........................... | 375/347 |
| 7,593,449 B2* | 9/2009 | Shattil | ........................... | 375/130 |
| 7,593,761 B1* | 9/2009 | Toth et al. | ..................... | 600/407 |
| 7,965,761 B2* | 6/2011 | Shattil | .......................... | 375/147 |
| 8,116,597 B2* | 2/2012 | Watanabe et al. | ............. | 382/305 |
| 8,126,296 B2* | 2/2012 | Watanabe et al. | ............. | 382/307 |

* cited by examiner

*Primary Examiner* — Lam T Mai
(74) *Attorney, Agent, or Firm* — Winston Hsu; Scott Margo

(57) ABSTRACT

An analog-to-digital converting method for converting an analog signal to a digital signal is disclosed. The analog-to-digital converting method includes decomposing the analog signal into a major analog signal and a minor analog signal, converting the major analog signal to a major digital signal, determining to which of a plurality of default sections the minor analog signal belongs to generate a minor digital signal correspondingly, and combining the major digital signal and the minor digital signal to form the digital signal.

4 Claims, 7 Drawing Sheets

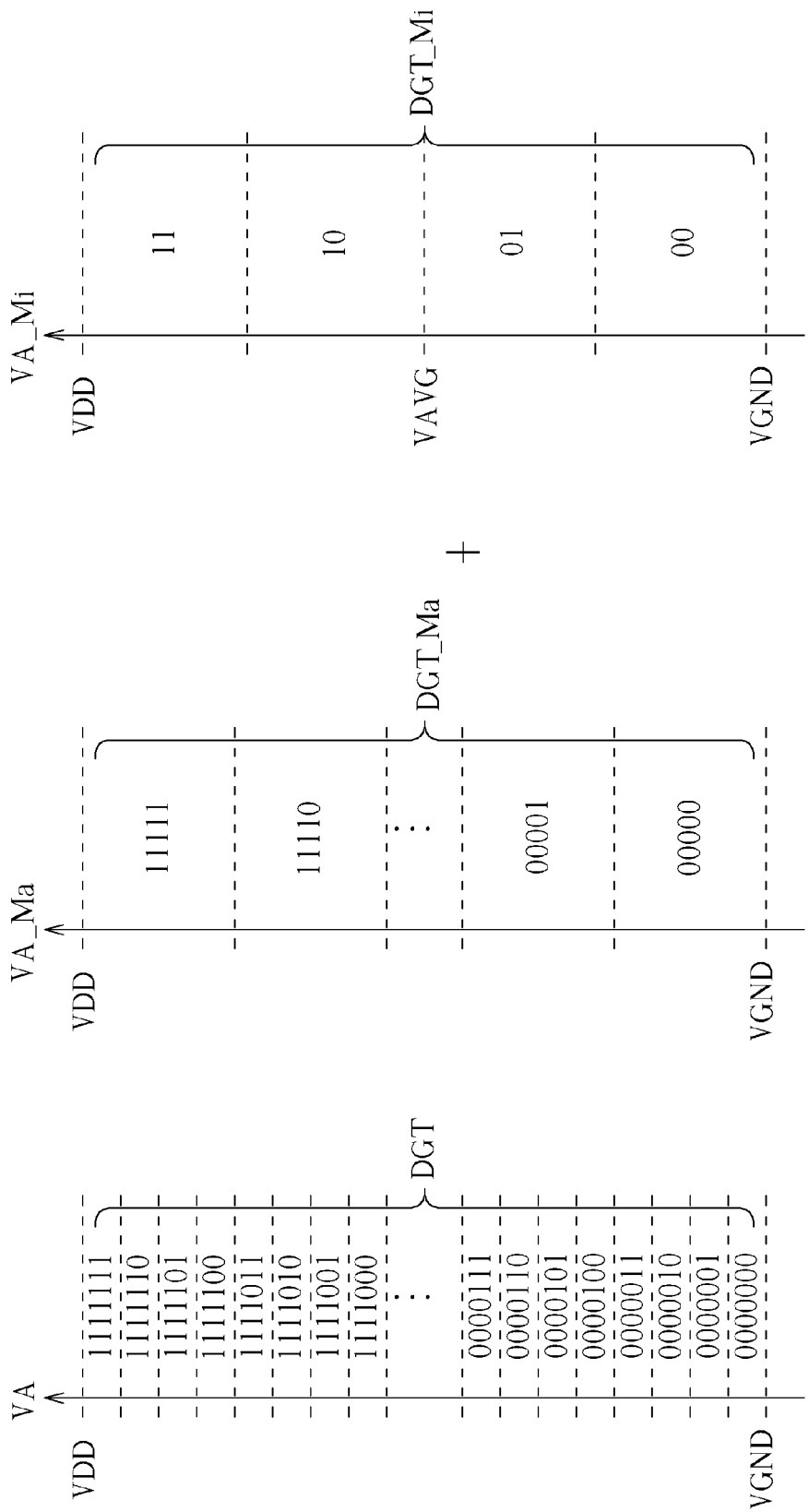

ANALOG-TO-DIGITAL CONVERTING METHOD AND FUNCTIONAL DEVICE USING THE SAME

BACKGROUND OF THE INVENTION

1. Field of the Invention

The present invention is related to an analog-to-digital converting method and related functional device, and more particularly, to an analog-to-digital converting method and related functional device which decompose and convert an analog signal.

2. Description of the Prior Art

With advances in integrated circuit manufacturing, an analog-to-digital converter (ADC) is allowed to output a digital signal composed of more bits. In such a situation, a value represented by the digital signal can more precisely approach an analog signal received by the ADC. To do so, the ADC requires more circuit layout area, complexity, and robustness against noise. If noise rejection of the ADC is insufficient, signal distortion occurs during the analog-to-digital conversion, which offsets advantages of the additional bits of the digital signal.

For example, please refer to FIG. 1, which is a schematic diagram of an audio amplification device 10 of the prior art. The audio amplification device 10 adjusts volume of an audio signal ADO based on a reference voltage VR, and includes an ADC 100 and an amplifier 110. The ADC 100 is utilized for converting the reference voltage VR into an N-bit volume control signal VOL. The amplifier 110 is utilized for adjusting the volume of the audio signal ADO according to the volume control signal VOL to output an adjusted audio signal ADO'.

Please continue to refer to FIG. 2, which is a schematic diagram of a conversion relationship between the reference voltage VR and the volume control signal VOL in the ADC 100. In general, a voltage range of the reference voltage VR is between a power voltage VDD and a ground voltage VGND. If the power voltage is 5V, the ground voltage is 0V and N=6, every stage of the volume control signal VOL corresponds to $(5-0)/2^6=78$ mV of the voltage range of the reference voltage VR. That is, the ADC 100 utilizes 78 mV as a unit to convert the reference voltage VR into the volume control signal VOL. If the power voltage VDD decreases from 5V to 2.5V or the bit number N increases from six to seven, the conversion unit of the ADC 100 further decreases to 39 mV. In other words, if the power voltage VDD decreases or the bit number N increases, the ADC 100 requires higher conversion accuracy.

Once the reference voltage VR is given, the corresponding N-bit volume control signal VOL is acquired. However, when the audio amplification device 10 outputs high power, the power voltage VDD and the ground voltage VGND tend to vibrate. In such a situation, stages of the volume control signal VOL vibrate with the power voltage VDD and the ground voltage VGND, and therefore the reference voltage VR is converted into an erroneous volume stage and varies with output. When the stage height is further compressed due to the increased bit number N for more volume stages, probability of erroneous conversion increases, resulting in unstable volume of the audio amplification device 10. In a worse case scenario, when pins of the audio amplification device 10 are insufficient, the ADC 100 and the amplifier 110 have to share power reception pins, and parasitic resistors existing on the shared power reception routes deteriorate the offsets of the power voltage VDD and the ground voltage VGND and enlarge variation of the volume control signal VOL value corresponding to the given reference voltage VR.

Therefore, stabilization of conversion with a precision enhanced ADC has been a major focus of the industry.

SUMMARY OF THE INVENTION

It is therefore a primary objective of the claimed invention to provide an analog-to-digital converting method and a functional device using the same.

The present invention discloses an analog-to-digital converting method for converting an analog signal to a digital signal. The analog-to-digital converting method comprises decomposing the analog signal into a major analog signal and a minor analog signal, converting the major analog signal to a major digital signal, determining to which of a plurality of default sections the minor analog signal belongs to generate a minor digital signal correspondingly, and combining the major digital signal and the minor digital signal to form the digital signal.

The present invention further discloses a functional device comprising a major input pin, for receiving a major analog signal, a minor input pin for receiving a minor analog signal, an analog-to-digital converter (ADC) for converting the major analog signal into a major digital signal, a classifier for determining to which of a plurality of default sections the minor analog signal belongs to generate a minor digital signal correspondingly, and a functional chip for combining the major digital signal and the minor digital signal to form the digital signal to accordingly perform a function of the functional device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6A is a schematic diagram of a 7-bit conversion relationship of an ADC.

FIG. 6B is a schematic diagram of a 5-bit conversion relationship of the ADC and a 2-bit conversion relationship of the classifier.

DETAILED DESCRIPTION

Figure 1:
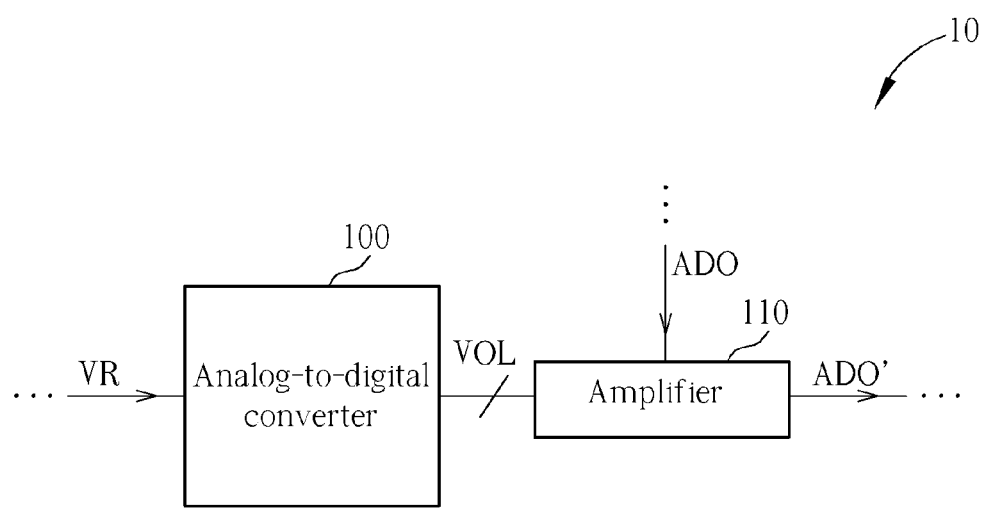
FIG. 1 is a schematic diagram of an audio amplification device of the prior art.
Figure 2:
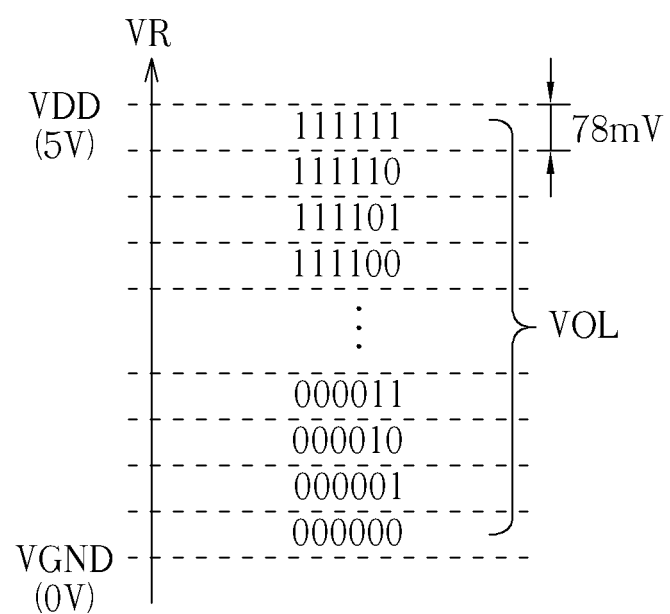
FIG. 2 is a schematic diagram of a conversion relationship between a reference voltage and a volume control signal of an ADC of the audio amplification device shown in FIG. 1.
Figure 3:
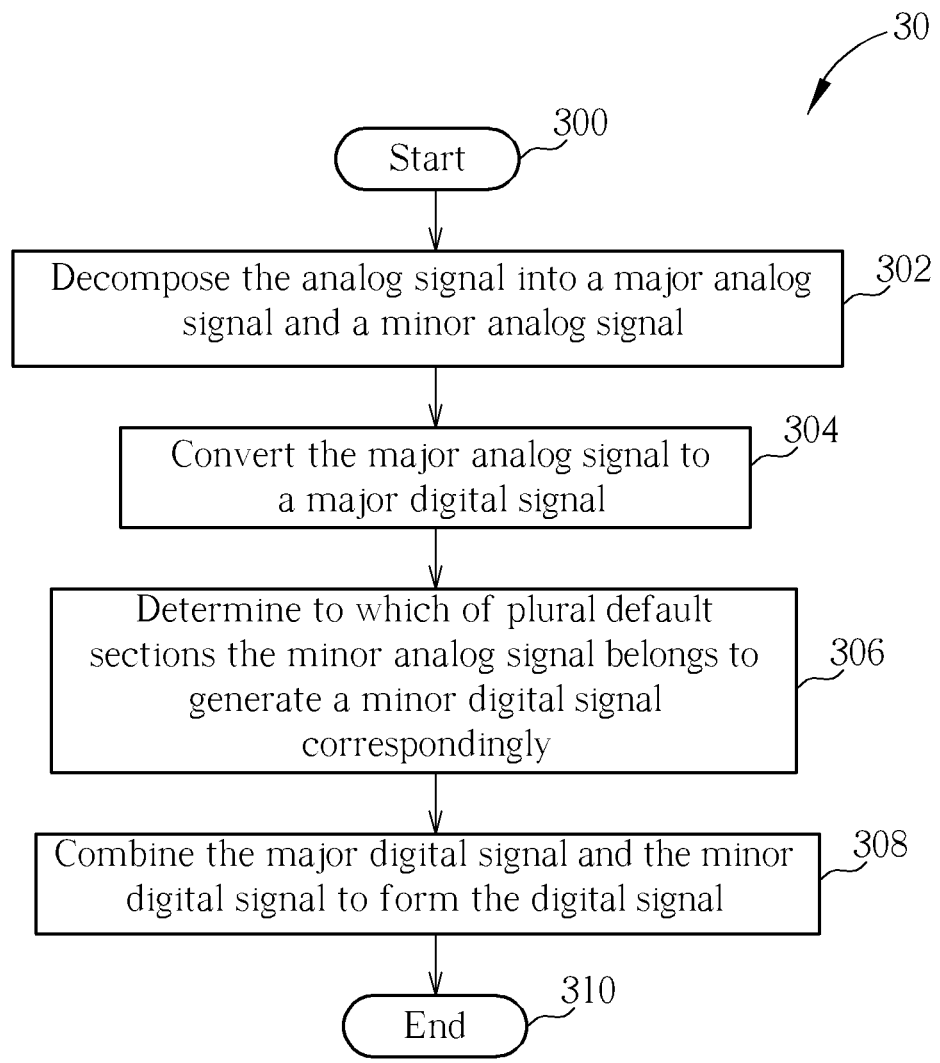
FIG. 3 is a schematic diagram of an analog-to-digital converting process according to an embodiment of the present invention.

Please refer to FIG. 3, which is a schematic diagram of an analog-to-digital converting process 30 according to an embodiment of the present invention. The analog-to-digital converting process is utilized for converting an analog signal to a digital signal, and includes the following steps:

Step 300: Start.

Step 302: Decompose the analog signal into a major analog signal and a minor analog signal.

Step 304: Convert the major analog signal to a major digital signal.

Step 306: Determine to which of plural default sections the minor analog signal belongs to generate a minor digital signal correspondingly.

Step 308: Combine the major digital signal and the minor digital signal to form the digital signal.

Step 310: End.

In short, to overcome the problems of erroneous conversion, additional cost, and robustness issues that arise due to additional bits of the analog-to-digital converter (ADC), information of the analog signal is separately carried by the major analog signal and the minor analog signal. The minor signal preferably carries information of a rough region to which the analog signal belongs, and the major analog signal carries information of a precise position of the analog signal within that rough region. Finally, the major digital signal and the minor digital signal are combined to form the digital signal, which is equivalent to a digital signal converted by a high-bit ADC. To reduce the bit number of the employed ADC, the analog signal is decomposed and separately transmitted to enlarge an error tolerance range for the analog signal. Compared to the analog signal, the major analog signal carries less information, and therefore can be converted by an ADC with lower bit number. Since reducing the bit number of the ADC can significantly reduce circuit layout area, analog-to-digital conversion with decomposition features a lower manufacturing cost and a broader error tolerance range.

Figure 4:
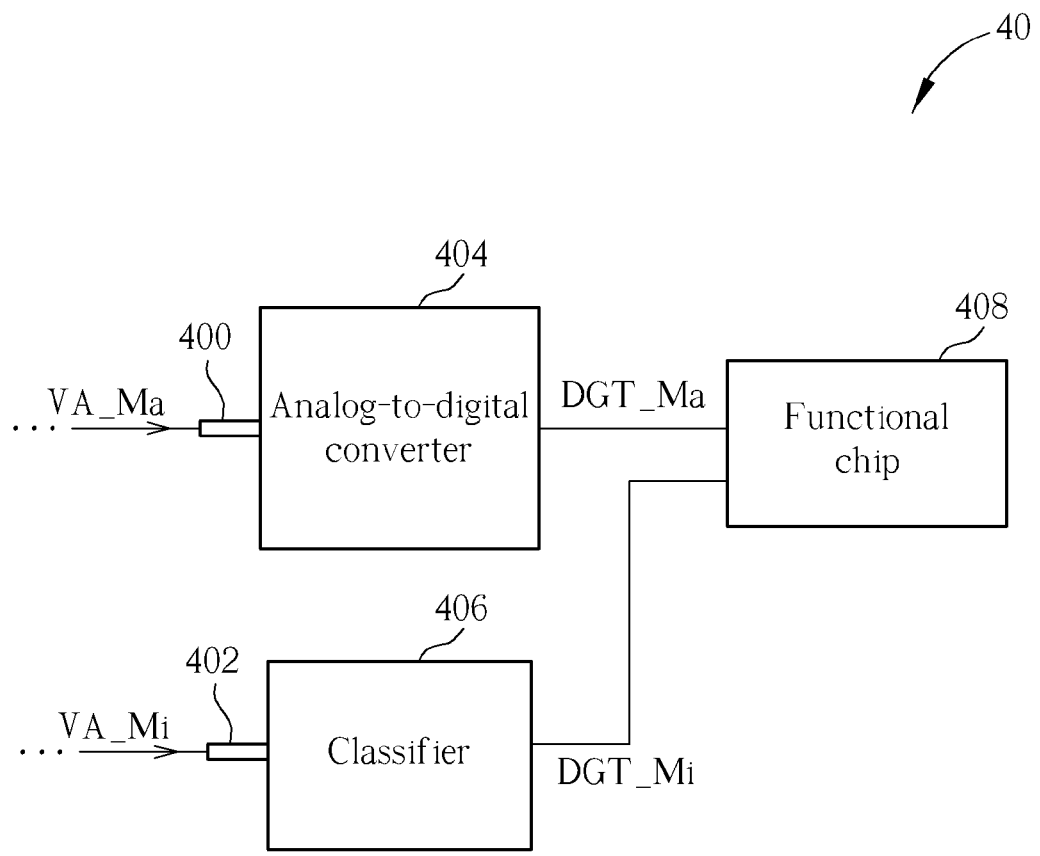
FIG. 4 is a schematic diagram of a functional device according to an embodiment of the present invention.

More specifically, please refer to FIG. 4, which is a schematic diagram of a functional device 40 according to an embodiment of the present invention. The functional device 40 includes a major input pin 400, a minor input pin 402, an ADC 404, a classifier 406 and a functional chip 408. The major input pin 400 is utilized for receiving a major analog signal VA_Ma. The minor input pin 402 is utilized for receiving a minor analog signal VA_Mi. The ADC 404 is utilized for converting the major analog signal VA_Ma into a major digital signal DGT_Ma. The classifier 406 is utilized for determining to which of plural default sections the minor analog signal VA_Mi belongs to generate a minor digital signal DGT_Mi correspondingly. Finally, the functional chip 408 combines the major digital signal DGT_Ma and the minor digital signal DGT_Mi to form the digital signal DGT to accordingly perform a function of the functional device 40.

Figures 5A, 5B:
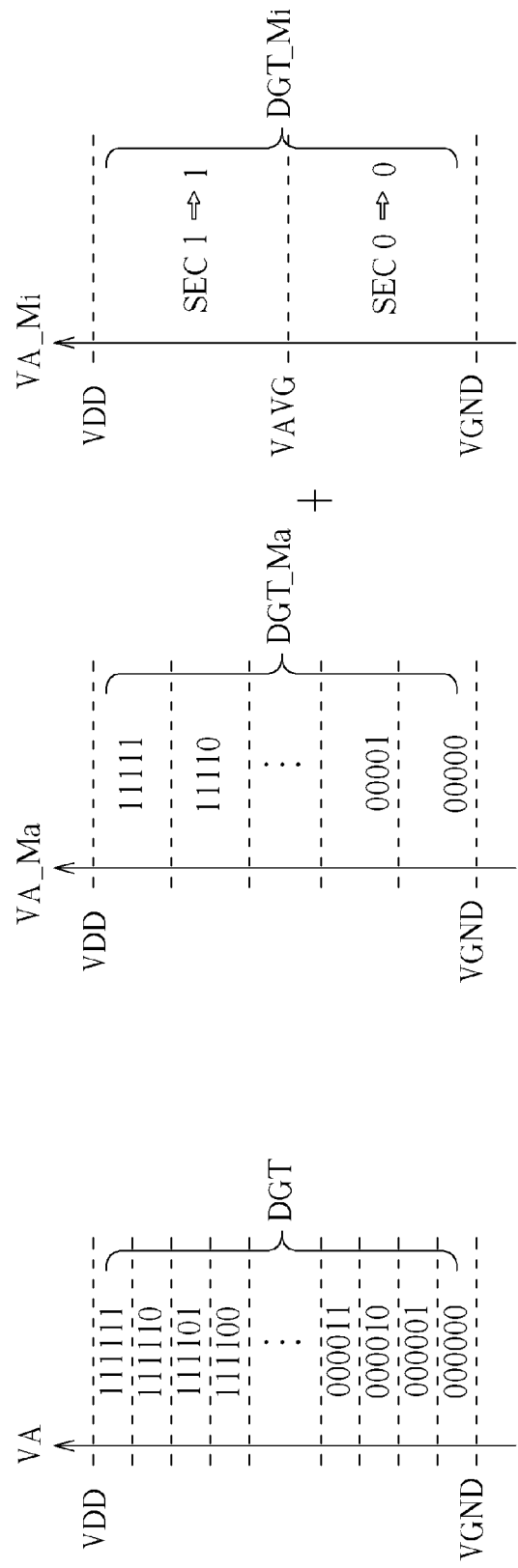
FIG. 5A is a schematic diagram of a 6-bit conversion relationship of an ADC.
FIG. 5B is a schematic diagram of a 5-bit conversion relationship of an ADC shown in FIG. 4 and a 1-bit conversion relationship of a classifier shown in FIG. 4.

For example, assume that the ADC 404 is a 5-bit ADC. Please refer to FIG. 5A and FIG. 5B. FIG. 5A is a schematic diagram of a 6-bit conversion relationship of an ADC, and FIG. 5B is a schematic diagram of a 5-bit conversion relationship of the ADC 404 and a 1-bit conversion relationship of the classifier 406. In FIG. 5A and FIG. 5B, a stage of the 5-bit major digital signal DGT_Ma is twice as broad as a stage of the 6-bit digital signal DGT, and the conversion relationship of the 1-bit classifier 406 is simple enough to be implemented by a simple logic circuit, such as an inverter, which output logic "1" when the minor analog signal VA_Mi being closer to a power voltage VDD or logic "0" when the minor analog signal VA_Mi being closer to a ground voltage VGND. For example, if the analog signal VA is converted to "111101" as the 6-bit digital signal DGT according to the conversion relationship shown in FIG. 5A, the decomposed major analog signal VA_Ma is converted to "11101" as the major digital signal DGT_Ma (second-most to least significant bits) according to the conversion relationship shown in FIG. 5B, and the decomposed minor analog signal VA_Mi belongs to a default section SEC1 corresponding to "1". Accordingly, the classifier 406 generates "1" as the minor digital signal DGT_Mi (most significant bit, MSB). Finally, the functional chip 408 combines the major digital signal DGT_Ma and the minor digital signal DGT_Mi to be "111101", which is identical to the digital signal DGT: "111101" in the conversion relationship shown in FIG. 5A. More specifically, if the functional device 40 is an audio amplification device, which adjusts volume to one of 64 stages according to magnitude of the analog signal VA, the functional chip 408 adjusts the volume to the 61st stage according to the combined digital signal DGT: "111101".

The analog-to-digital conversion featuring decomposition can further be applied to different combinations of bit numbers. Please refer to FIG. 6A and FIG. 6B. FIG. 6A is a schematic diagram of a 7-bit conversion relationship of an ADC. FIG. 6B is a schematic diagram of a 5-bit conversion relationship of the ADC 404 and a 2-bit conversion relationship of the classifier 406. Each stage of the 5-bit major digital signal DGT_Ma shown in FIG. 6B is four times as broad as each stage of the 7-bit digital signal DGT shown in FIG. 6A, and therefore probability of erroneous conversion is further reduced. Even though slightly more complicated than the 1-bit conversion relationship shown in FIG. 5B, the 2-bit conversion relationship can still be easily implemented by a 2-bit ADC. That is, as long as the bit numbers of the major digital signal DGT_Ma and the minor digital signal DGT_Mi are less than the bit number of the digital signal DGT, decrease of the bit number of the ADC can significantly reduce circuit layout area and the manufacturing cost, and also enlarge the error tolerance range for the analog signal.

Figure 7:
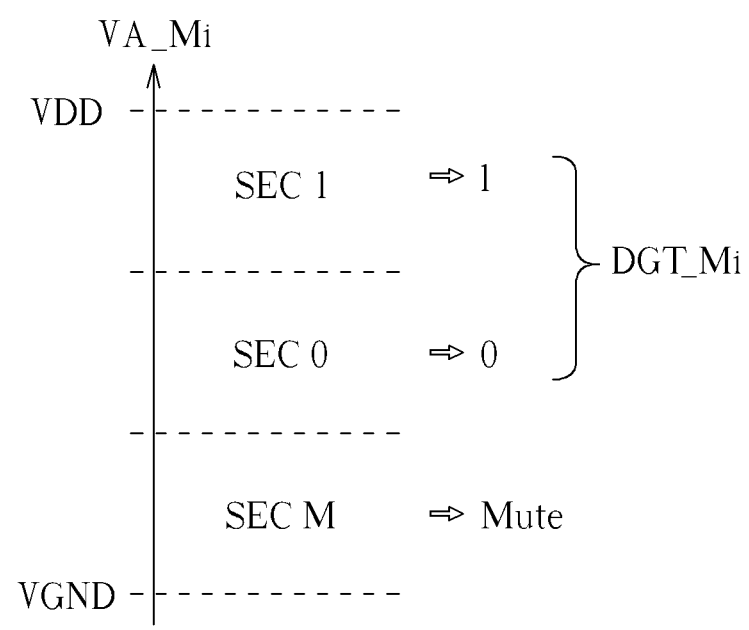
FIG. 7 is a schematic diagram of an alternative conversion relationship of the ADC shown in FIG. 7.

In addition, when the functional device 40 is packaged, number of pins may be limited. For that reason, the minor input pin 402 can further be utilized for controlling more than one function, since allocation of the voltage range of the minor input pin 402 as illustrated in FIG. 5B and FIG. 6B is abundant. For example, if the functional device 40 is the audio amplification device, the minor input pin 402 and a mute pin can be combined. In such a situation, the minor analog signal VA_Mi is converted to the minor digital signal DGT_Mi according to a conversion relationship illustrated in FIG. 7. In FIG. 7, a part (default section SECM) of the voltage range of the minor analog signal VA_Mi corresponds to an enable mode of a mute function. That is, when the minor analog signal VA_Mi belongs to the default section SECM, the functional chip 408 disables volume control, and activates the mute functions to reduce the pin number.

In the prior art, error tolerance range for the analog signal shrinks with the increase of the bit number N of the ADC 100. In such a situation, undesired factors, e.g. noise and power voltage offset, easily result in erroneous analog-to-digital conversion. In comparison, according to the present invention, the high-bit analog-to-digital conversion is replaced by the low-bit analog-to-digital conversions. Therefore, the high-bit ADC is no longer required, and the employed low-bit ADC allows a broader tolerance range for erroneous conversion than the high-bit ADC. As a result, probability of successful conversion is enhanced, and the manufacturing cost of the functional device 40 is reduced.

To sum up, the high-bit analog-to-digital conversion is replaced by the low-bit analog-to-digital conversions to reduce the manufacturing cost and enhance the probability of successful conversion.

Those skilled in the art will readily observe that numerous modifications and alterations of the device and method may be made while retaining the teachings of the invention.

What is claimed is:

1. A functional device comprising:
a major input pin, for receiving a major analog signal;
a minor input pin, for receiving a minor analog signal;
an analog-to-digital converter (ADC), for converting the major analog signal into a major digital signal;
a classifier, for determining to which of a plurality of default sections the minor analog signal belongs to generate a minor digital signal correspondingly; and
a functional chip, for combining the major digital signal and the minor digital signal to form the digital signal to accordingly perform a function of the functional device.

2. The functional device of claim 1, wherein each of the plurality of sections corresponds to a digital number or an operation mode of a functional device.

3. The functional device of claim 1, wherein the major digital signal and the minor digital signal include fewer bits than the digital signal.

4. The functional device of claim 1, wherein the functional device is an audio amplification device and the digital signal is utilized for indicating volume of the audio amplification device.

* * * * *